US009184309B2

(12) United States Patent
Baumbach et al.

(10) Patent No.: US 9,184,309 B2
(45) Date of Patent: Nov. 10, 2015

(54) SOLAR MODULE

(75) Inventors: Joerg Baumbach, Munich (DE);
Hermann Calwer, Munich (DE);
Walter Stetter, Munich (DE); Helmut Vogt, Munich (DE)

(73) Assignee: SHELL ERNEUERBARE ENERGIEN GMBH, Hamburg (DE)

( * ) Notice: Subject to any disclaimer, the term of this patent is extended or adjusted under 35 U.S.C. 154(b) by 1419 days.

(21) Appl. No.: 12/866,026

(22) PCT Filed: Mar. 11, 2009

(86) PCT No.: PCT/EP2009/052813
§ 371 (c)(1),
(2), (4) Date: Oct. 7, 2010

(87) PCT Pub. No.: WO2009/112503
PCT Pub. Date: Sep. 17, 2009

(65) Prior Publication Data
US 2011/0017279 A1    Jan. 27, 2011

(30) Foreign Application Priority Data
Mar. 11, 2008   (EP) ...................................... 08102493

(51) Int. Cl.
*H01L 31/05* (2014.01)
*H01L 31/02* (2006.01)
*H01L 31/0475* (2014.01)
*H02S 40/34* (2014.01)

(52) U.S. Cl.
CPC ....... *H01L 31/02008* (2013.01); *H01L 31/0475* (2014.12); *H02S 40/34* (2014.12); *Y02E 10/542* (2013.01)

(58) Field of Classification Search
CPC .................. H01L 31/02008; H01L 31/0475
USPC ......................................................... 136/251
See application file for complete search history.

(56) References Cited

U.S. PATENT DOCUMENTS 4,371,739 A * 2/1983 Lewis et al. .................... 136/251
4,759,803 A * 7/1988 Cohen ........................... 136/244
(Continued)

FOREIGN PATENT DOCUMENTS

| EP | 1041647 | 10/2000 |
| EP | 1220329 | 7/2002 |
| JP | 58-207679 | 12/1983 |
| NL | 8702572 | 5/1989 |

OTHER PUBLICATIONS

PCT International Search Report for PCT/EP2009/052813 filed on Mar. 11, 2009 in the name of Shell Erneuerbare Energien GmbH.
(Continued)

*Primary Examiner* — Golam Mowla
(74) *Attorney, Agent, or Firm* — Steinfl & Bruno LLP

(57) ABSTRACT

A solar module comprising a sheet; a plurality of solar cells electrically connected in series between first and second conductor lines, and arranged on a first side of the sheet, wherein the first and second conductor lines each extend along a length on the sheet; a first conductor lead in electrical connection with the first conductor line and a second conductor lead in electrical connection with the second conductor line; and a through-hole in the sheet through which the first conductor lead extends to a second side of the sheet and a further through-hole through which the second conductor lead extends to the second side of the sheet.

6 Claims, 6 Drawing Sheets

(56) References Cited

U.S. PATENT DOCUMENTS

Figure 1:
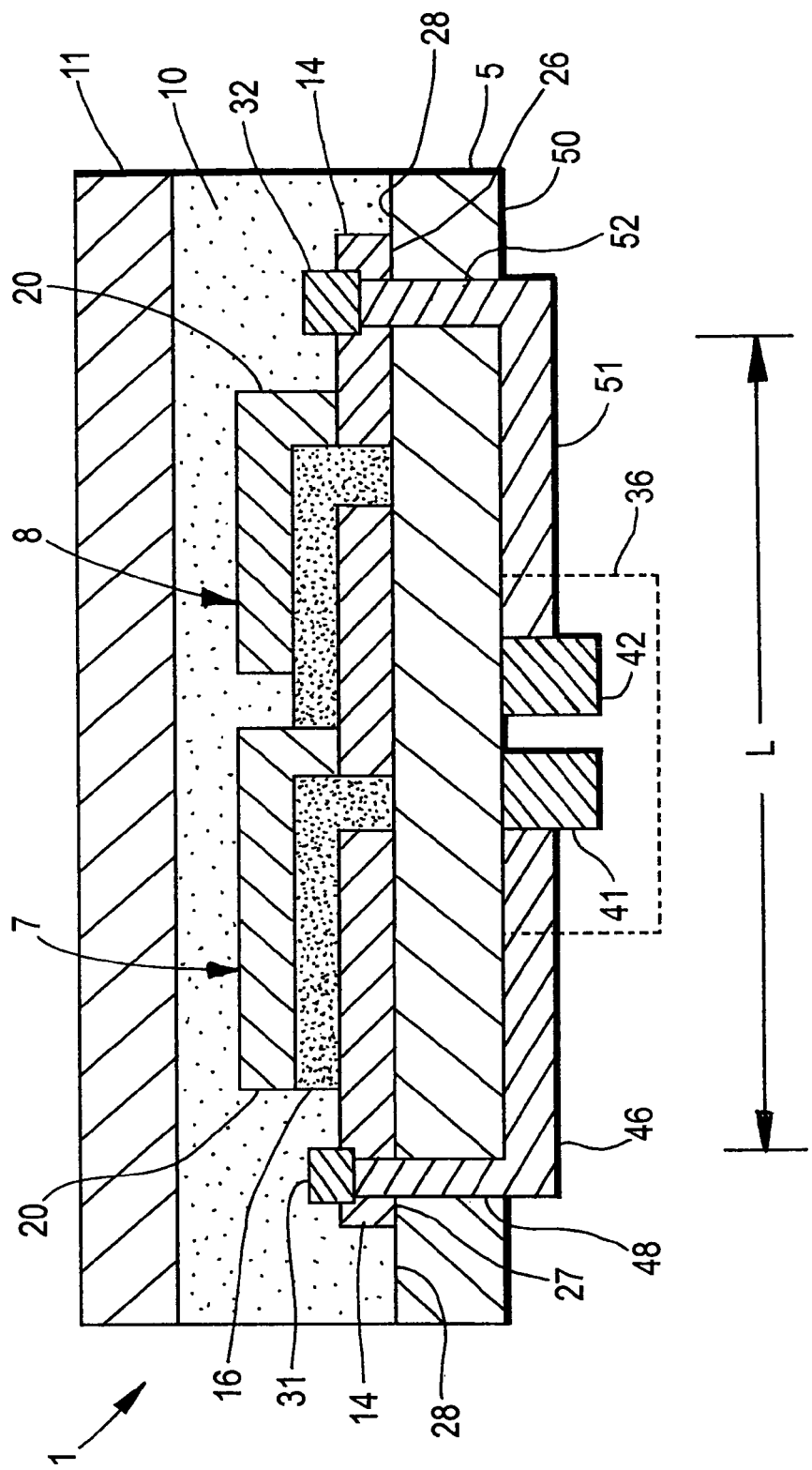

| | | | | |
|---|---|---|---|---|
| 4,830,038 A | * | 5/1989 | Anderson et al. | 136/251 |
| 5,008,062 A | * | 4/1991 | Anderson et al. | 264/272.15 |
| 5,043,024 A | * | 8/1991 | Cammerer et al. | 136/244 |
| 5,071,491 A | * | 12/1991 | Stein et al. | 136/251 |
| 5,140,397 A | * | 8/1992 | Haga et al. | 257/53 |
| 5,527,716 A | * | 6/1996 | Kusian et al. | 438/74 |
| 5,578,502 A | | 11/1996 | Albright et al. | |
| 5,626,688 A | | 5/1997 | Probst | |
| 6,307,144 B1 | | 10/2001 | Mimura | |
| 2005/0072456 A1 | * | 4/2005 | Stevenson et al. | 136/244 |

OTHER PUBLICATIONS

PCT Written Opinion for PCT/EP2009/052813 filed on Mar. 11, 2009 in the name of Shell Erneuerbare Energien GmbH.

Palm, J. et al. *Second generation CIS solar modules*. Solar Energy, vol. (77), 2004. pp. 757-765.

*Shell PowerMax Eclipse 80-C Solar Panel from Shell Solar*. POSHARP—The Source for Renewables. Web. Retrieved on Oct. 17, 2014 from <http://www.posharp.com/shell-powermax-eclipse-80-c-solar-panel-from-shell-solar_p417373385d.aspx>.

* cited by examiner

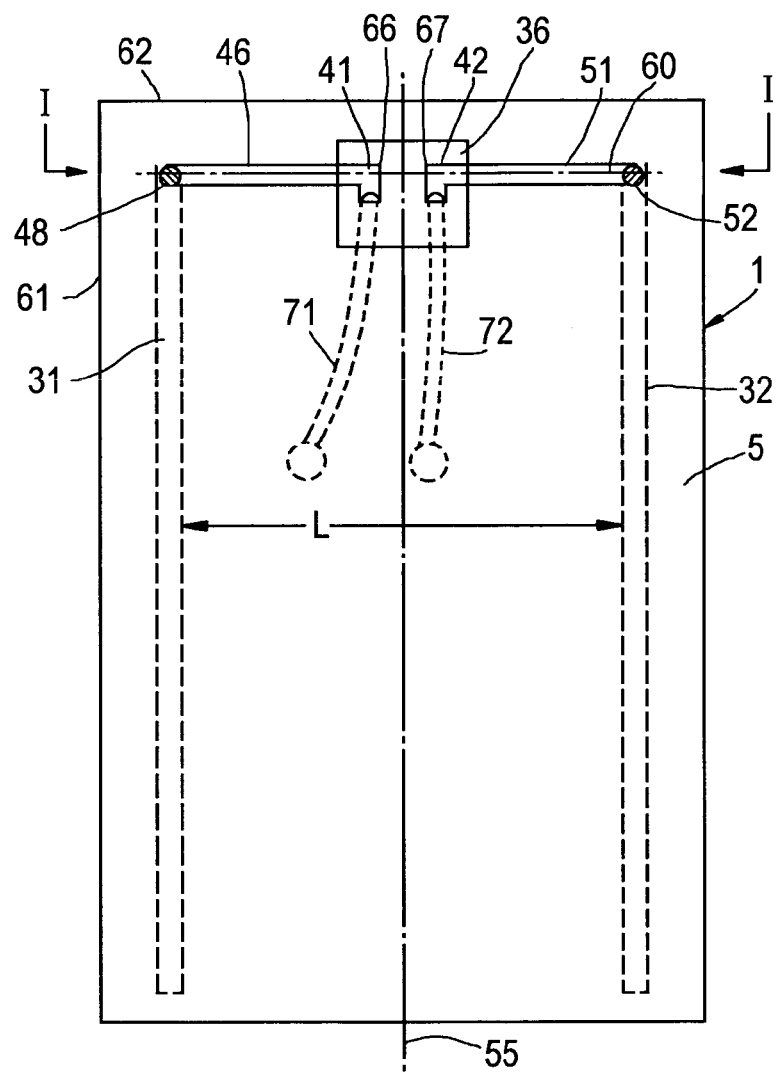

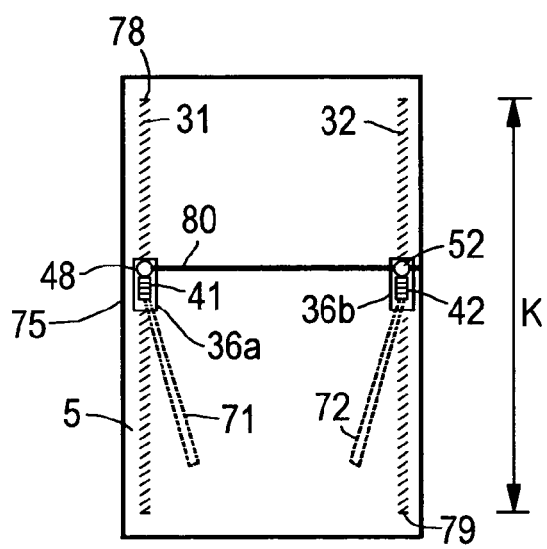
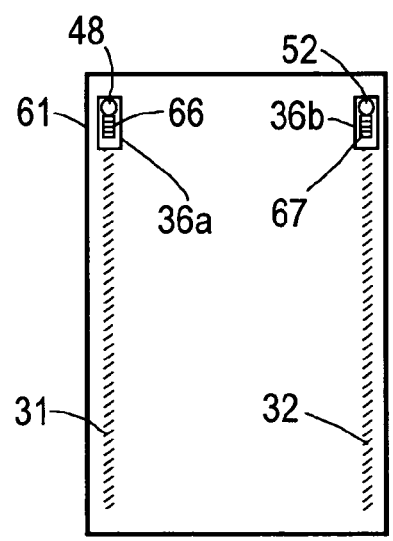
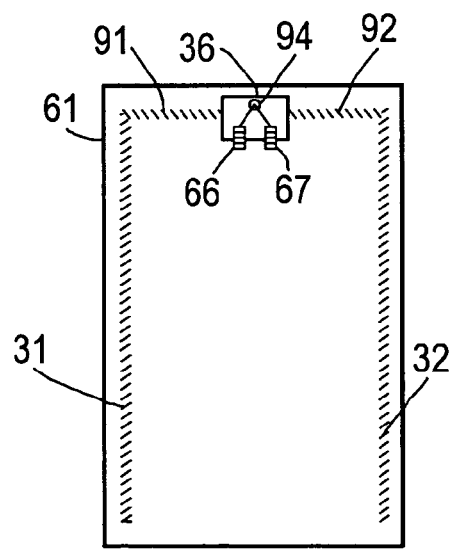

SOLAR MODULE

CROSS REFERENCE TO RELATED APPLICATIONS

The present application is the US national stage of International Application PCT/EP2009/052813 filed on Mar. 11, 2009 which, in turn, claims priority to European application EP08102493.7, filed on Mar. 11, 2008.

The present invention relates to a solar module.

A solar module typically contains a plurality of solar cells connected in series, since each cell only produces a limited voltage that is lower than required as output voltage from the module. The output voltage that is generated between the first and last solar cell, and is typically withdrawn by means of conductor lines, such as in the form of metal ribbons, which are also referred to as bus bars. The conductor lines are arranged on one side of a sheet, such as a glass plate, and the electrical current needs to be guided from the conductor lines to one or two connection boxes, also referred to as junction boxes, to which an electrical load can be connected.

The brochure "Shell Power Max Eclipse 80-C Produktinformation", V1/PowerMaxEclipse/80-C-Grid-Power/D/11/05 SAP Ref.: 400829 discloses a conventional solar module including a series of copper-indium-diselenide-type thin film solar cells. The solar cells of the known module are arranged on a rectangular glass plate, with conductor lines running parallel with the long sides of the glass plate, and the solar cells are arranged in series between the conductor lines. In this module, two series connections are arranged, so that in total two pairs of conductor lines are present. A front glass is laminated on the solar cell structure, and the conductor lines are laterally led out of the module, via a circuit board at the short side of the module to a common connector box. The circuit board provides for the parallel connection of the two series connections, for which conductor lines need to be crossed, which is not possible within the thickness of the laminate. On the other hand, a circuit board consumes space that is not available as active area of the module. The known module is of substrate type or design, whereby the substrate, on which the solar cells are arranged during manufacture, is at the side opposite the light-receiving side of the final module.

Even in designs with a single series connection per module, guiding leads laterally out of a laminate structure, such as e.g. with so-called edge connectors, is not ideal as it can impair the electrical performance and long-term stability of the module.

U.S. Pat. No. 5,578,502 discloses a solar module of superstrate type. Cells are connected in series, of which the first and last are each fitted with a bus bar. In the superstrate design, the substrate forms the light-receiving side of the solar module. A back cover is provided, and a junction box is arranged over a hole in the back cover, through which hole leads from both bus bars may extend, which leads can be connected to contacts of the junction box.

Other solar modules of superstrate design are disclosed in EP 1 041 647 A1 and EP 1 220 329 A2.

In connecting the connector box to the conductor lines, several technical requirements have to be met and taken into account. One such requirement is sufficient insulation between current-conducting parts of the module and its frame or the surroundings, both under dry and wet conditions, e.g. as put down in standard IEC 61646. An issue in meeting this requirement is the ingress of moisture at the edges of the module, which can potentially lead to increased conductivity, leak currents and sparkovers. Another requirement is a sufficiently high maximum back current with which the module can be operated without damage in forward direction, with regard to the diode characteristic of the solar cells. This is for example a subject of standards DIN EN 50380 and IEC 61730. The maximum back-current can be highest there, where the conductor lines are led to the rear side of the sheet. On the other hand, it is desired to keep the cross-section of conductor lines minimum, because thick conductor lines result in a more difficult and expensive encapsulation, and wide conductor lines result in a decrease of active photovoltaic area of the module. Meeting these requirements in modules of substrate type is of particular interest. In superstrate-type modules there is generally more flexibility in arranging the electrical connections at the back side after arranging the solar cells.

It is an object of the present invention to provide an improved solar module, in particular of the substrate type.

In accordance with the invention there is provided a solar module comprising a substrate, forming or being part of a sheet;
a plurality of solar cells electrically connected in series between first and second conductor lines, and arranged on a first side of the sheet, wherein the first and second conductor lines each extend along a length on the sheet;
a first conductor lead in electrical connection with the first conductor line and a second conductor lead in electrical connection with the second conductor line; and
a through-hole in the sheet through which the first conductor lead extends to a second side of the sheet and a further through-hole in the sheet through which the second conductor lead extends to the second side of the sheet.

The sheet will hereafter also be referred to as a connection sheet.

The first and second conductor lines extending on the sheet and are spaced apart from each other. The spacing between the first and second conductor lines is the minimum spacing that can be measured between them along their length. The invention allows to maximise the active photovoltaic area on a module, without needing to compromise on other technical requirements such as sufficient insulation and maximum back current In one embodiment the first and second conductor lines are spaced apart from each other by a spacing; and the solar module further comprises a connection box with a first connector in electrical connection with the first conductor line and a second connector in electrical connection with the second conductor line, wherein at least one of the first and second connectors is in electrical connection with the respective conductor line by the respective conductor lead extending through the sheet, and which conductor lead extends along the second side of the sheet for a distance of at least 25% of the spacing.

In an aspect of this embodiment, the invention provides an improved interconnection between the conductor lines and a single connection box. By guiding the conductor lead (or both conductor leads) along the second side of the connection sheet, which will typically be the rear side of the solar module opposite its light-facing side, the active area of the module is maximised, while a convenient single connection box is provided.

In a particular class of embodiments, a contact point between at least one of the conductor leads and the respective conductor line is located at a distance of from 20% to 50% of the length of the respective conductor line, counted from an end thereof. By arranging the contact point away from an end portion of the conductor line, ohmic losses in the conductor line are minimized, because the average length for the current to travel along the conductor line is shortened. This allows lowering the cross-sectional area of the conductor line, such as decreasing the thickness and/or width, with advantages for encapsulation and/or active surface. In particular, contact points between both the first conductor line and the first conductor lead, and the second conductor line and the second conductor lead, can be located at a distance of from 20% to 50% of the length of the respective conductor line, counted from an end thereof.

Accordingly, this aspect of the invention is actually also achieved in any solar module comprising
- a sheet;
- a plurality of solar cells electrically connected in series between first and second conductor lines, and arranged on a first side of the sheet, wherein the first and second conductor lines each extend along a length on the connection sheet and are spaced apart from each other by a minimum spacing; and
- a connection box with a first connector in electrical connection with the first conductor line and a second connector in electrical connection with the second conductor line, for connecting an electrical load to the first and second conductor lines, wherein at least one of the first and second connectors is in electrical connection with the respective conductor line by a conductor lead, and wherein a contact point between the conductor lead and the respective conductor line is located at a distance of from 20% to 50% of the length of the respective conductor line, counted from an end thereof.

A solar module comprising
- a sheet;
- a plurality of solar cells electrically connected in series between first and second conductor lines, and arranged on a first side of the sheet, wherein the first and second conductor lines each extend along a length on the sheet; and
- a connection box with a connector in electrical connection with one of the first and second conductor lines, wherein the connector is in electrical connection with the respective conductor line by a conductor lead, and wherein a contact point between the conductor lead and the respective conductor line is located at a distance of from 20% to 50% of the length of the respective conductor line, counted from an end thereof.

Suitably the connection box is arranged at a second side of the sheet opposite the first side where connection lines are arranged, which second side will typically be the rear side of the solar module opposite its light-facing side.

The connection box with a connector in electrical connection with one of the first and second conductor lines serves for connecting an electrical load to the respective conductor line. In particular the first and second contacts serve for connecting an electrical load to the first and second conductor lines. Several solar modules are often connected in series by their contacts to form a module array, and in that case the load is a load of the module array.

In one embodiment a single connection box is provided. Instead of a single connection box, also two connection boxes can be employed without departing from the invention. Then, the two connection boxes suitably are a first connection box with a first connector in electrical connection with the first conductor line and a second connection box with a second connector in electrical connection with the second conductor line, for connecting an electrical load to the first and second conductor lines. The electrical load can be connected to both contacts of both connection boxes.

In one embodiment the connection box has two connectors, a first connector in electrical connection with the first conductor line and a second connector in electrical connection with the second conductor line. An electrical load can be connected to the first and second conductor lines. Moreover in this embodiment each of the connectors is in electrical connection with the respective conductor line by a conductor lead, and wherein a contact point between the conductor lead and the respective conductor line is located at a distance of from 20% to 50% of the length of the respective conductor line, counted from an end thereof.

In one embodiment, the first and second conductor lines are substantially parallel, such as along the long sides of a rectangular module. Suitably further at least one connection box or the connection box is arranged substantially at a position along a virtual middle line between the first and second conductor lines.

Also, the first and second conductor leads can extend through the connection sheet at positions that substantially lie on a virtual perpendicular line crossing the first and second conductor lines, and wherein the connection box is substantially arranged along that virtual perpendicular line. In this case the length of the conductor leads along the rear side to a single connection box can be minimized.

In one embodiment the connection box can be arranged near an end portion of at least one of the first and second conductor lines.

In one embodiment, at least one of the conductor leads and at least one of the conductor lines are integrally formed, i.e. integrated, rather than interconnected, so they can both form part of the same lead. The conductor line, such as in the form of a metal ribbon, can be provided with sufficient length so that it extends through the connection sheet as conductor lead to the connection box. This obviates the need for interconnecting the conductor line with the conductor lead, in particular in the area of a through-hole in the connection sheet.

In one embodiment, one or both connectors are a terminal of the connection box.

In another embodiment, one or both connectors comprise a connection lead extending from the connection box. The connection leads and the respective conductor leads can be integrally formed, i.e. they can both form part of the same lead.

A particular embodiment is as follows.
A solar module comprising
- a connection sheet;
- a plurality of solar cells electrically connected in series between first and second conductor lines, and arranged on a first side of the connection sheet, wherein the first and second conductor lines each extend along a length on the connection sheet and are spaced apart from each other by a minimum spacing; and
- a connection box with a first connector in electrical connection with the first conductor line and a second connector in electrical connection with the second conductor line, for connecting an electrical load to the first and second conductor lines, wherein at least one of the first and second connectors is in electrical connection with the respective conductor line by a conductor lead extending through the connection sheet, and along the second side of the connection sheet for a distance of at least 25% of the minimum spacing.

The connection sheet can form part of the encapsulation of the solar module.

Figure 3A:
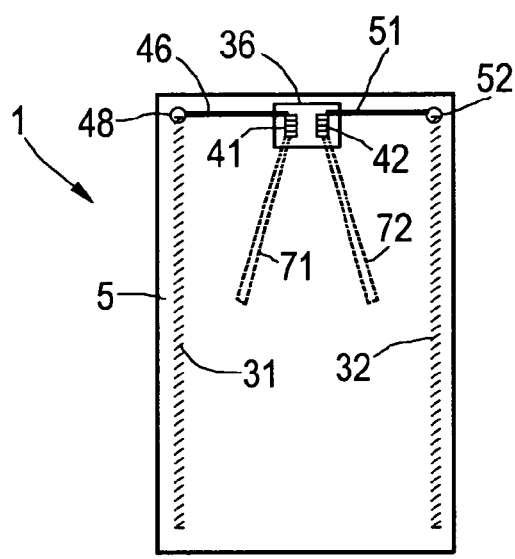
Figure 4:
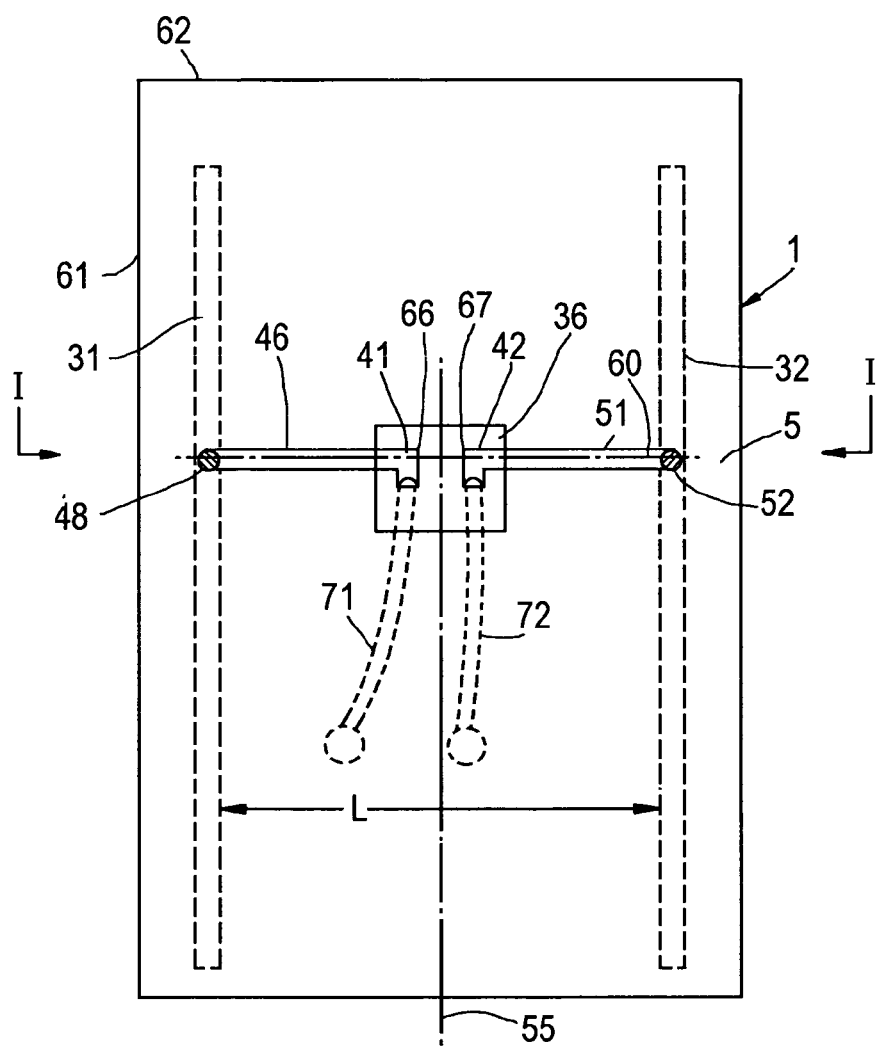

Elements of the invention will now be further discussed with reference to the drawings, wherein FIG. 1 is a cross section through a schematic embodiment of a module according to the invention;

FIG. 2 shows schematically an embodiment of a module with the cross section of FIG. 1 in top view, onto the side of the connection sheet opposite the light-receiving side;

FIG. 3a,b,c,d,e,f,g,h show schematically further embodiments of the present invention in the same view as FIG. 2;

FIG. 4 shows schematically another embodiment of a module with a cross-section as in FIG. 1 in top view, onto the side of the connection sheet opposite the light-receiving side; and FIG. 5a,b show schematically further embodiments of the present invention in the same view as FIG. 2; and FIG. 6 shows schematically a conventional design of a solar module.

Like reference numerals are used in different Figures to denote the same or similar objects.

Reference is made to FIG. 1, which schematically shows an embodiment of a solar module 1 according to the present invention.

The solar module 1, shown in cross-section, is of the substrate type, which means that the connection sheet 5 forms the substrate on which the solar cells 7,8 are arranged, before they are encapsulated by a lamination foil 10, such as polyvinyl butyral foil or ethylene vinyl acetate foil, and a front cover 11, such as a front glass. The connection sheet 5 can in particular be a glass substrate, such as of float glass. For providing some mechanical stability, which is desired for example for the substrate during the arrangement of the solar cells, the sheet can have a thickness of 0.5 mm or more, e.g. from 0.5 mm to 20 mm, such as from 1 to 6 mm, in particular the sheet, e.g. of float glass, can be of 1-4 mm thickness. The front cover 11 forms the light-receiving side of the module.

For simplicity, in this schematic embodiment only two solar cells 7,8 are shown in series connection. The number of serially connected solar cells can typically be between 2 and 500, preferably between 50 and 200, such as about 100.

The present invention is applicable to all types of solar cells, including conventional crystalline silicon solar cells and thin-film solar cells, including those based on the following non-exhaustive list of silicon-based thin film, chalcopyrite compounds, II-VI compounds and analogues, III-V compounds and analogues, organic materials, and dye-sensitized solar cells. Thin-film solar cells are preferred, in particular chalcopyrite based solar cells.

The term chalcopyrite compound is herein employed as a genus term that covers materials formed of a group I-III-VI$_2$ semiconductor or a group II-IV-V$_2$ semiconductor, including a p-type semiconductor of the copper indium diselenide ("CIS") type. Special cases are sometimes also denoted as CIGS or CIGSS. It covers at least the following species: CuInSe$_2$; CuIn$_x$Ga$_{(1-x)}$Se$_2$; CuIn$_x$Ga$_{(1-x)}$Se$_y$S$_{(2-y)}$; CuIn$_x$Ga$_z$Al$_{(1-x-z)}$Se$_y$S$_{(2-y)}$, and combinations thereof; wherein 0≤x≤1; 0≤x+z≤1; and 0≤y≤2. The chalcopyrite compound may further comprise a low concentration, trace, or a doping concentration of one or more further elements or compounds, in particular alkali such as sodium, potassium, rubidium, caesium, and/or francium, or alkali compounds. The concentration of such further constituents is typically 5 wt % or less, preferably 3 wt % or less.

The term II-VI compounds is herein employed as a genus term that covers compounds wherein any number of group II elements from the periodic system and any number of group VI elements from the periodic system are present. Amongst examples are ZnSe, ZnS, ZnS$_x$Se$_{1-x}$, ZnS$_x$(OH)$_{1-x}$, CdS, CdSe, CdTe. Other elements may be present in such compounds, such as for instance doping elements and trace elements.

The term III-V compounds is herein employed as a genus term that covers compounds wherein any number of group III elements from the periodic system and any number of group V elements from the periodic system are present. Amongst examples are GaAs, Al$_x$Ga$_{1-x}$As, In$_x$Ga$_{1-x}$As, GaP, In$_x$Ga$_{1-x}$P, In$_x$Ga$_{1-x}$As$_z$P$_{1-z}$ (wherein 0≤z≤1). Other elements may be present, such as for instance doping elements and trace elements.

The term absorber layer is intended to cover multiple layers, in particular multiple thin film layers, and moreover other layers may be located between the back electrode layer and the front electrode layer in addition to the absorber layer. As an example, in the case of a chalcopyrite absorber layer, a window layer or buffer layer may be present. An example is a layer of a II-VI compound such as for example CdS, such as at the interface with a front electrode comprising e.g. zinc oxide.

The embodiment of FIG. 1 will be discussed at the hand of solar cells 7,8 having a chalcopyrite type absorber layer.

A back contact comprises a metal layer 14 deposited upon substrate 5. Layer 14, in a preferred embodiment, typically comprises or consists of a highly conductive metal. Of specific importance are considered copper, aluminium, molybdenum, tungsten, and silver. Often applied are molybdenum layers that are deposited by sputtering to a thickness of about 0.2 to 2 microns.

On top of the back electrode 14 a chalcopyrite type semiconductor layer 16 (also referred to as CIS type layer) is arranged, having a thickness of about 0.2 to 2 microns, and being for example of p-type.

The CIS type layer 16 can be formed by any method available in the art. A preferred method includes sputter deposition of a sequence of layers comprising the metal constituents of the CIS type layer, optionally depositing a Se layer by vapour deposition, followed by rapid thermal processing. A preferred process is described in J. Palm, V. Probst and F. H. Karg, "Second generation CIS solar modules" Solar Energy, vol. 77, p. 757-765, 2004, incorporated by reference.

Between the substrate 5 and back electrode layer 14 a diffusion barrier layer (not shown) can be arranged, which serves to suppress diffusion of alkali metals from the glass substrate into the CIS layer 16. If such a layer is arranged, it clearly forms part of the substrate before the solar cells are arranged. Further, the CIS type layer preferably contains a controlled amount of Na, as disclosed in U.S. Pat. No. 5,626, 688, included by reference.

On top of the CIS layer a buffer layer and/or window layer can be deposited, such as of CdS, or of a Cd-free material.

The solar cells further comprise a front electrode layer 20. The layer 20 can in particular be a transparent conductive oxide (TCO), such as zinc-oxide (ZnO) or indium-tin-oxide (ITO), preferably ZnO. The TCO layer can e.g. be deposited by means of sputtering. The layer is doped opposite to the semiconductor type of the absorber layer, such as n-type when the absorber layer is p-type. Sputtering can for example be done by DC sputtering from an ZnO:Al target, or by reactive sputtering from a metallic target. The layer is appropriately doped to provide relatively low resistivity, for example, better than about $2.0 \times 10^{-3}$ Ohm·cm, and preferably better than $1.0 \times 10^{-3}$ Ohm·cm. The thickness of the layer 20 is suitably 0.5 to 2 microns.

The back electrode layer 14, absorber layer 16 and front electrode layer 20 are patterned such that separate solar cells 7,8 are formed, which are connected in series. In particular, the front electrode layer 20 of solar cell 7 is in electrical connection with the back electrode layer 14 of solar cell 8. The front electrode layer 20 of the last solar cell 8 of the series is in electrical connection with the back electrode layer 14 in a region 26 adjacent solar cell 8. The back electrode layer of the first cell of the series, solar cell 7, also extends to a region 27 adjacent the first cell. Suitably the back electrode layer 14 stays clear of an edge region 28 along the edges of the module 1. On the regions 26 and 27 and in electrical contact therewith, conductor lines 31 and 32 are arranged, which will be referred to as first and second conductor lines, respectively, hereafter. The conductor lines can e.g. be metal ribbons such as of copper, aluminium, molybdenum, optionally coated with e.g. nickel, palladium, tin or silver. The first and second conductor lines in this example are parallel and therefore also linear, and have a spacing L.

On the rear side of the connection sheet 5 a connection box 36 is arranged. The connection box 36 is provided with two connectors 41 and 42, which will hereafter be referred to as first and second connectors, respectively. To the connectors 41, 42 an electrical load (not shown) can be connected.

The first connector 41 is in electrical connection with the first conductor line 31, by a conductor lead 46. The conductor lead 46 extends through a hole 48 in the connection sheet 5, and continues along the second side 50 of the connection sheet 5.

In this embodiment, the second connector 42 is connected to the second conductor line 32 in an analogous and symmetrical manner, by second conductor lead 51 that extends through the connection sheet 5 via hole 52. In this embodiment, the distance between the hole 48 and the connector 41 is at least 25% of the spacing L, and therefore also the distance between the holes 48 and 52 is at least 25% of the spacing L.

According to an aspect of the invention, the first connector 41 is in electrical connection with the first conductor line 31 by the conductor lead 46, and the contact point at the hole 48 between the conductor lead 46 and the respective conductor line 31 can be located at a distance of from 20% to 50% of the length of the respective conductor line 31, counted from an end thereof, i.e. along the respective conductor line. Suitably, also the contact point at the hole 52 between the second conductor lead 51 and the respective conductor line 32 is then located at a distance of from 20% to 50% of the length of the second conductor line 32, counted from an end thereof. Such embodiments are shown in FIGS. 3d-3h,4,5a, and further detail will be discussed with reference to these Figures.

It shall be clear that an expression in the specification and in the claims that a component such as a solar cell, conductor line, connection box etc. are arranged on a particular side of the connection sheet and/or substrate, it does not necessarily mean that such component is directly on the particular side. It is however possible that the component is directly arranged on that side.

The connection box 36 can be provided in various arrangements as shown in FIGS. 2-5.

In FIG. 2 an embodiment of the module 1 is schematically shown in a view on the connection sheet 5 (i.e. from below in FIG. 1). FIG. 1 represents a cross-section along line I-I. For the sake of clarity, only the bus bars 31,32, and not the solar cells between them are indicated. In this view it becomes clear that the parts of the conductor leads 46,51 running along the rear surface of the module between the holes 48,52 and the connectors 41,42 do not cover any surface on the light-receiving side. So, in this embodiment there is no active surface consumed by the interconnection between conductor lines 31,32 and the connection box 36.

It will often be preferred to arrange the junction box symmetrically between the conductor lines 31,32 as shown, i.e. at a position along the virtual middle line 55 between the first and second conductor lines 31,32.

The width of the connector box, measured perpendicular to middle line 55, is typically less than 25% of the minimum spacing L. A typical minimum spacing is e.g. in the range of from 10 to 100 cm, in particular 40-80 cm.

In the embodiment as shown in FIG. 2, the holes 48, 52 through which the first and second conductor leads extend through the connection sheet lie on a virtual perpendicular line 60, crossing the first and second conductor lines 31,32 and the virtual line 55 at right angles. In this embodiment, moreover the conductor leads 46,51 extend along that line 60, and the connection box 36 is arranged along that line 60 as well.

The connector box is shown here at an end portion 61 of the conductor lines 31,32, which is here near a short side of the rectangular module 1, but could also be arranged further away from an edge, or even at the centre of the module.

Preferably the distance between a through-hole for a conductor lead and the edge of the module is chosen such that sufficient insulation is achieved. The maximum voltage of the module is of influence here. For example, good insulation is achieved when the edge region 28 in FIG. 1 is free of thin films and forms together with the polyvinyl butyral lamination foil 10, having conductivity of $1 \cdot 10^{-12}$ $(\text{Ohm·cm})^{-1}$, an insulation zone. The edge region can e.g. be between 5 and 50 mm wide, preferably between 10 and 20 mm, such as 15 mm. A maximum system voltage of up to 1000 V can be achieved, or even more.

Each of the conductor leads 46,51 can be an integral extension of the conductor lines 31, or 32, respectively. The conductor leads can extend to connectors in the form of terminals 66,67 in the connection box. The connectors can also extend as connection leads extending from the connection box 36, indicated in the Figure as 71,72.

A connection lead 71,72 and a respective conductor lead 46 and/or 51 can be integrally formed.

When a conductor lead is not an integral extension of a conductor line, it can be electrically connected to the conductor line by known means, such as by soldering, welding, or by mechanical means such as a spring contact. The electrical connection can in particular be provided in the holes and/or the surrounding area. The holes 48,52 are suitably sealed against ingress of moisture, such as by butyl or epoxide. It shall be clear that the electrical connection forms part of the conductor leads.

The connection box can for example be glued to the rear side of the connection sheet 5. In the connection box other electrical or electronic components can be arranged, such as one or more bypass diodes. The connection box can have a lid that can be opened, such as for the installation and/or connection of a load. It can also be sealed, while having external connectors and/or conduction leads (so-called one-piece junction cap).

Reference is made to FIG. 3, showing schematically and by way of example various embodiments of the present invention. FIGS. 3a-3c relate to embodiments wherein through-holes 48 and 52 are provided at an end portion 61 of the module, and FIGS. 3d-3h relate to embodiments wherein the through-holes are provided at a central portion 75 of the module.

FIG. 3a is a further simplified version of the embodiment of FIG. 2. In the other Figures only the parts relevant for discussing the respective modification will be indicated by reference numbers, all other parts as indicated are the same or similar as in FIGS. 2 and 3a.

Figure 3B:
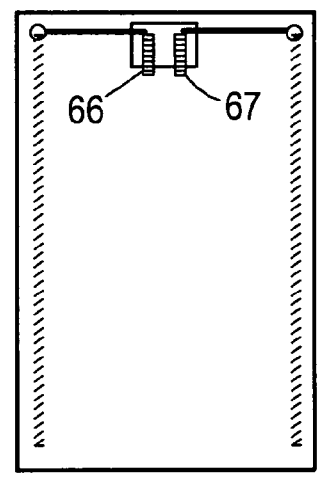

In FIG. 3b, terminals 66,67 at the connection box 36 are provided instead of connection leads 71,72.

Figure 3C:
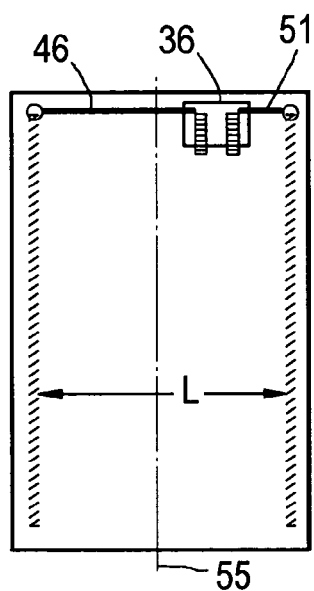

In FIG. 3c, the connection box 36 is arranged away from the middle line 55. Conductor line 46 is longer than 25% of the spacing L, in fact longer than 40%, more in particular longer than 50% of the spacing L. Conductor line 51 may be shorter than that.

Figure 3D:
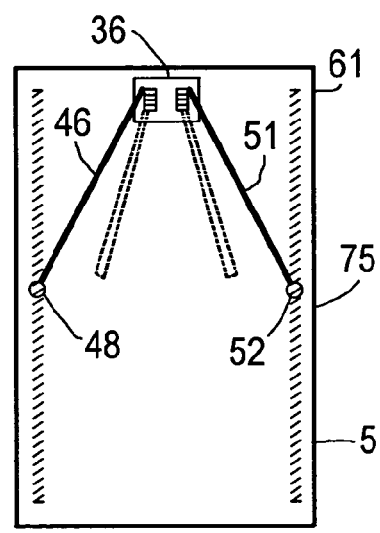

In FIG. 3*d*, through-holes 48 and 52 are provided in the central portion 75 of the module, substantially in the middle of each conductor line 31,32. The conductor leads 46,51 run skewed from contact points at the through-holes to the connection box 36 at the end portion 61 of the module. The end portion with respect to a length or width of a module can be the area within the first or last 20% of that length or width. Skewed leads provide the shortest connection, but is shall be clear that the conductor leads can also be arranged along other pathways.

Figure 3E:
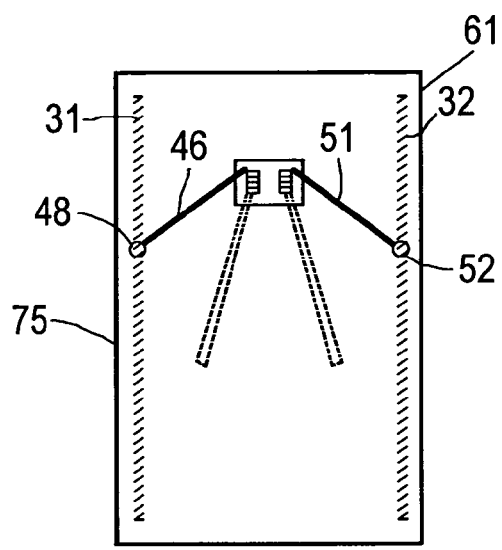

FIG. 3*e* shows a variant in which the conductor lines 31,32 are also contacted via holes 48,52 in the central portion 75 of the connection sheet 5, be it not exactly in the middle of the busbars. The central portion with respect to a length or width of a module can be the area within the central 20% of that length or width. Also the connection box 36 is outside the end portion, and the conductor leads 46,51 run skewed.

Figure 3F:
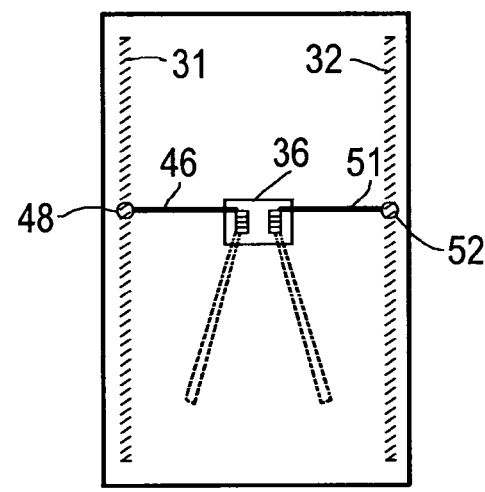

The embodiment of FIG. 3*f* combines features from FIGS. 3*a* and 3*d*. The through-holes and contact points 48,52, as well as the connection box 36 are all provided in the central portion 75. The conductor leads run perpendicular to the parallel conductor lines 31,32.

Figure 3G:
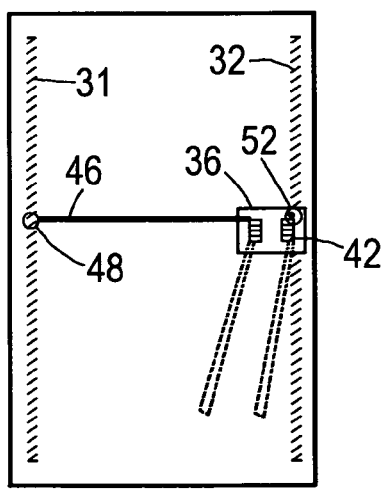

The embodiment in FIG. 3*g* differs from that in 3*f* in that the connection box 36 is arranged in the central portion 75, and near one of the conductor lines. In fact, the connector 42 is arranged very close to the through-hole 52, which is covered by the junction box 36.

Figure 3H:
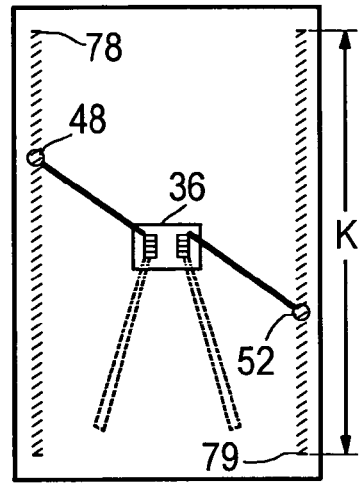

In FIG. 3*h*, the connection box 36 is centrally arranged, and the holes 48, 52 are arranged at either side in longitudinal direction, somewhat away from the middle of the conductor lines 31,32, but within 20-50% of the length K, counted from an end 78,79 of the conductor lines 31,32. It would also be possible that one of the holes 46,51 is arranged at an end portion, less than 20% of the length K away from an end 78 or 79.

FIG. 4 shows the embodiment of FIG. 3*f*) in the detail of FIG. 2. The through-holes 48 and 52 are arranged in the middle, or substantially in the middle, of the conductor lines 31,32, i.e. contact points between the first and second conductor leads and the respective conductor lines are both located at a distance of from 20% to 50% of the length of the respective conductor line, counted from an end thereof. The connector box is shown here in the central portion 75 of the module, but could also be arranged further away from the centre. FIG. 1 is again a cross-section along lines I-I.

Instead of a single connection box, also two connection boxes can be employed without departing from the invention. The invention then still gives flexibility in choosing the location for the connection boxes without sacrificing active area of the module. Reference is made to FIG. 5*a*, showing schematically and by way of example a further embodiment of the present invention, where two connection boxes 36*a*,36*b* are applied. The same reference numerals as in FIGS. 1-4 are used to refer to the same or similar parts. Each connection box 36*a*, 36*b* in this embodiment is arranged above a through-hole 48,52, respectively. Both through-holes are provided in the central area 75, such as in the middle of the busbars.

In one embodiment a bypass diode can be arranged between the contacts 41,42, so as to carry away current in the case of partial shading of the module. Shading of one or several individual solar cells in a module consisting of a larger number of series connected solar cells may lead to reverse biasing of the shaded cell(s). In the embodiment of FIG. 4, the bypass diode may be arranged in one of the connection boxes 36*a,b*. Connection wiring 80 between the junction boxes runs along the back side of the module. In a particularly advantageous embodiment the connection wiring is covered by a frame element which serves for increasing mechanical stability of the module. In the embodiment schematically shown in FIG. 5 the frame can be formed of a frame around the four sides of the module and a connection bar running along the wiring 80. The connection bar can be hollow and/or have a recess such as at the side of the module so as to cover the wiring 80.

In the further embodiment in FIG. 5*b* the two through-holes and connection boxes 36*a,b* are arranged in the end portion 61, at the ends of the bus bars 31,32. Optionally a bypass diode and wiring 80 as in FIG. 5*a* may be provided between the connection boxes.

FIG. 6 shows schematically a conventional layout of a module with busbars 31,32 as well as conductor leads 91,92. These conductor leads have substantially the same shape as busbars extending over the light-facing side of the sheet, in particular at the side of the solar cells in substrate design. The connectors 66, 67 are connected to the conductor leads 91,92 via a common through-hole 94. The area underneath 91,92 is not available as active area.

A calculation of ohmic losses in various configurations of a module was done, for rectangular modules of 165 cm×65 cm size, with aluminium busbars of 0.2 mm thickness and 2 mm width. For the conventional layout shown in FIG. 6, an ohmic loss of 0.83% was determined, wherein the connector leads 91,92 had a width and thickness identical to the bus bar.

For the layout of FIG. 5*b*, the ohmic loss was 0.53%. By guiding the conductor leads separately through the sheet, ohmic losses along the leads 91,92 are accumulated. That would be the case also when a single junction box like in FIGS. 3*a*-3*c* was employed, since at the rear side much thicker conductor leads can be used.

For the arrangement of FIG. 5*a*, an ohmic loss of 0.14% was calculated. In this case with the contact points and through-holes in the middle of the conductor lines, current is only transported over half the length of a bus bar. It shall be clear that this benefit of the invention can also be exploited by dimensioning the busbars smaller than e.g. needed for the conventional arrangement of FIG. 6, without higher than conventional ohmic losses.

The invention is also applicable to modules comprising a plurality of series-connections of solar cells. In that case, at least third and fourth, and optionally further pairs of conductor lines are present on the first side of the connection sheet, with a series connection of solar cells between each pair. Each pair of conductor lines has a respective minimum spacing. Each conductor line can be connected to a connection box at the second side of the conductor lead extending through the connection sheet. In a particular embodiment at least one of the conductor lines extends along the second side for a distance of at least 25% of the respective minimum spacing for that conductor line. In particular, the distance can be at least 25% of a width of the module (for a rectangular module the width is shorter or equal to the length). In such a design according to the invention, an additional advantage can be achieved when the parallel connection of the different series is provided in the connection box, so that no separate circuit board is needed.

The through-holes in the connection sheet are suitably provided underneath the conductor lines (bus bars), for easy contacting, and also no substantial area outside the bus bars is consumed for the conduction leads. It shall however be clear that a conductor lead can also be led through the connections sheet some distance from the conductor lines, in which case the conductor line can consume a limited amount of active area. Suitably, the through-holes are arranged within 5 cm from the conductor lines, and/or within 5% from the spacing between the conductor lines.

The invention has been discussed at the hand of examples using the so-called substrate design, whereby the substrate on which the solar cells are arranged during manufacture forms, or is part of, the connection sheet. The invention has particular advantages in combination with a substrate design; since in a superstrate design it is generally easier to arrange wiring and connections between bus bars, without substantially sacrificing active area of the module.

The invention claimed is:

1. A solar module, comprising:
    a substrate, forming a planar connection sheet with a thickness from 1 mm to 4 mm;
    a plurality of solar cells electrically connected in series between first and second conductor lines, and arranged on a first side of the sheet, wherein the first and second conductor lines each extend along a length on the sheet;
    a first conductor lead in electrical connection with the first conductor line and a second conductor lead in electrical connection with the second conductor line;
    a first through-hole in the sheet through which the first conductor lead extends to a second side of the sheet; and
    a second through-hole in the sheet through which the second conductor lead extends to the second side of the sheet,
    wherein the first through-hole and the second through-hole in the planar connection sheet are provided underneath the conductor lines and are arranged in virtual planes perpendicularly crossing the planar sheet;
    a first connection box with a first connector in electrical connection with the first conductor line and a second connection box being different and spatially separated from the first connection box with a second connector in electrical connection with the second conductor line, wherein the first connection box covers the first through-hole and the second connection box covers the second through-hole; and
    wherein contact points between both the first conductor line and the first conductor lead, and the second conductor line and the second conductor lead, are located at a distance of from twenty percent to fifty percent of a length of the respective conductor line away from an end thereof.

2. The solar module according to claim 1, wherein the first and second conductor lines are substantially parallel.

3. The solar module according to claim 1, wherein the first and second conductor lines are substantially parallel, wherein the first and second conductor leads extend through the sheet at positions that substantially lie on a virtual perpendicular line crossing the first and second conductor lines.

4. The solar module according to claim 1, wherein at least one of the conductor leads and at least one of the conductor lines are integrally formed with the sheet.

5. The solar module according to claim 1, wherein a bypass diode is provided electrically between the connector leads.

6. The solar module according to claim 1, wherein the solar module comprises an encapsulation, and wherein the sheet forms part of the encapsulation.

* * * * *